(12) United States Patent
Elmegreen et al.

(10) Patent No.: US 9,251,884 B2
(45) Date of Patent: Feb. 2, 2016

(54) NON-VOLATILE, PIEZOELECTRONIC MEMORY BASED ON PIEZORESISTIVE STRAIN PRODUCED BY PIEZOELECTRIC REMANENCE

(71) Applicant: International Business Machines Corporation, Armonk, NY (US)

(72) Inventors: Bruce G. Elmegreen, Goldens Bridge, NY (US); Glenn J. Martyna, Croton on Hudson, NY (US); Dennis M. Newns, Yorktown Heights, NY (US); Alejandro G. Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 14/222,813

(22) Filed: Mar. 24, 2014

(65) Prior Publication Data

US 2015/0269984 A1 Sep. 24, 2015

(51) Int. Cl.
*G11C 11/22* (2006.01)
*G11C 13/00* (2006.01)

(52) U.S. Cl.
CPC .............. *G11C 11/22* (2013.01); *G11C 13/00* (2013.01); *G11C 13/0002* (2013.01); *G11C 13/0004* (2013.01); *G11C 2013/0095* (2013.01)

(58) Field of Classification Search
CPC ................ G11C 11/22; G11C 13/00; G11C 2013/0095; G11C 13/0002; G11C 13/0004; H01L 45/06
USPC .................................... 365/157, 163, 189.011
See application file for complete search history.

(56) References Cited

U.S. PATENT DOCUMENTS

| | | | |
|---|---|---|---|
| 2,782,397 A | 2/1957 | Young | |
| 3,138,726 A | 6/1964 | Samuelson | |
| 3,740,118 A * | 6/1973 | Land et al. | ..................... 359/254 |
| 4,419,598 A | 12/1983 | Spitz et al. | |
| 4,589,009 A | 5/1986 | Motamedi | |
| 5,060,191 A | 10/1991 | Nagasaki et al. | |
| 5,231,326 A | 7/1993 | Echols | |
| 5,673,220 A | 9/1997 | Gendlin | |
| 5,760,675 A | 6/1998 | Lee et al. | |
| 5,796,298 A | 8/1998 | Kearney et al. | |
| 5,872,372 A | 2/1999 | Lee et al. | |
| 5,883,419 A | 3/1999 | Lee et al. | |

(Continued)

OTHER PUBLICATIONS

D. Balma, et al., "High Piezoelectric Longitudinal Coefficients in Sol-gel PZT Thin Film Multilayers," Jornal of the American Ceramic Society, 2013, pp. 1-31.

(Continued)

*Primary Examiner* — Richard Elms
*Assistant Examiner* — Xiaochun L Chen
(74) *Attorney, Agent, or Firm* — Cantor Colburn LLP; Vazken Alexanian

(57) ABSTRACT

A nonvolatile memory storage device includes a ferroelectric (FE) material coupled with a piezoresistive (PR) material through an inherent piezoelectric response of the FE material, wherein an electrical resistance of the PR material is dependent on a compressive stress applied thereto, the compressive stress caused by a remanent strain of the FE material resulting from a polarization of the FE material, such that a polarized state of the FE material results in a first resistance value of the PR material, and a depolarized state of the FE material results in a second resistance value of the PR material.

8 Claims, 16 Drawing Sheets

(56) References Cited

U.S. PATENT DOCUMENTS

| | | | |
|---|---|---|---|
| 5,938,612 A | 8/1999 | Kline-Schoder et al. | |
| 6,083,762 A | 7/2000 | Papen et al. | |
| 6,392,934 B1 | 5/2002 | Saluel et al. | |
| 6,548,942 B1 | 4/2003 | Panasik | |
| 6,683,803 B2 | 1/2004 | Gudesen et al. | |
| 7,193,283 B2 | 3/2007 | Park | |
| 7,208,786 B2 | 4/2007 | Chu | |
| 7,221,579 B2 | 5/2007 | Krusin-Elbaum et al. | |
| 7,253,488 B2 | 8/2007 | Zhan et al. | |
| 7,394,089 B2 | 7/2008 | Doyle et al. | |
| 7,411,818 B1 | 8/2008 | Elmegreen et al. | |
| 7,709,317 B2 | 5/2010 | Yang et al. | |
| 7,848,135 B2 | 12/2010 | Elmegreen et al. | |
| 7,968,945 B2 | 6/2011 | Lolivier et al. | |
| 7,973,350 B2 | 7/2011 | Collonge et al. | |
| 7,999,440 B2 | 8/2011 | Miller et al. | |
| 8,003,427 B2 | 8/2011 | Faraone et al. | |
| 8,004,154 B2 | 8/2011 | Cueff et al. | |
| 8,125,121 B2 | 2/2012 | Honda | |
| 8,159,854 B2 | 4/2012 | Elmegreen et al. | |
| 8,247,947 B2 * | 8/2012 | Elmegreen et al. | 310/328 |
| 8,405,279 B2 * | 3/2013 | Elmegreen et al. | 310/328 |
| 8,552,621 B2 | 10/2013 | Piazza et al. | |
| 8,598,039 B2 | 12/2013 | Wang et al. | |
| 8,604,670 B2 | 12/2013 | Mahameed et al. | |
| 2006/0054926 A1 | 3/2006 | Lahreche | |
| 2007/0235784 A1 | 10/2007 | Krusin-Elbaum et al. | |
| 2008/0289417 A1 | 11/2008 | Okada | |
| 2009/0026890 A1 | 1/2009 | Goat et al. | |
| 2010/0073997 A1 | 3/2010 | Elmegreen et al. | |
| 2010/0328984 A1 | 12/2010 | Elmegreen et al. | |
| 2011/0133603 A1 * | 6/2011 | Elmegreen et al. | 310/328 |
| 2012/0135590 A1 | 5/2012 | Hendrix et al. | |
| 2013/0009668 A1 | 1/2013 | Elmegreen et al. | |
| 2013/0020908 A1 | 1/2013 | Pott et al. | |
| 2013/0036827 A1 | 2/2013 | Besling | |
| 2013/0043767 A1 | 2/2013 | Yamamoto et al. | |
| 2014/0169078 A1 | 6/2014 | Elmegreen et al. | |

OTHER PUBLICATIONS

J. C. Crawford, "A Ferroelectric-Piezoelectric Random Access Memory," IEEE Transactions on Electron Devices, vol. 18, No. 10, 1971, pp. 951-958.

F.F.C. Duval et al.; "High Frequency PZT Composite Thick Film Resonators;" Integrated Ferroelectrics, 63, 2004; pp. 27-33.

C.J. Glassbrenner et al.; "Thermal Conductivity of Silicon and Germanium from 3K to the Melting Point;" Physical Review, vol. 134, No. 4A, May 18, 1964, pp. A1058-A1069.

HC Materials, [online]; [retrieved on Mar. 14, 2013]; retrieved from the Internet http://www.hcmat.com/Pmn_Properties.html HCMat, H.C. Materials Corporation, "Properties of Piezoelectric PMN-PT Crystal," 2004, pp. 1-4.

A. Husmann et al.; "Dynamical Signature of the Mott-Hubbard Transition in Ni(S,Se)2;" Science, vol. 274; Dec. 13, 1996; pp. 1874-1876.

A. Jayaraman et al.; "Continuous and Discontinuous Semiconductor-Metal Transition in Samarium Monochalcogenides Under Pressure;" Physical Review Letters, vol. 25, No. 20; Nov. 16, 1970; pp. 1430-1433.

B.S. Kang et al.; "Pressure-induced changes in the conductivity of AlGaN/GaN high-electron mobility-transistor membranes;" Applied Physics Letters, vol. 85, No. 14, Oct. 4, 2004; pp. 2962-2964.

Young-Tae Kim et al.; "Study on Cell Characteristics of PRAM Using the Phase-Change Simulation;" IEEE, 2003, pp. 211-214.

Ju. H. Krieger, "Acousto-Ferroelectric RAM-New Type of Nonvolatile Memory Device," IEEE, pp. 53-55, 2007.

G. Krill et al.; "Physical Properties of Compounds NiS2-xSex with Pyrite Structure: Metal-Non Metal Transition, Evidence of the Existence of an Antiferromaagnetic Metallic Phase;" Journal de Physique, vol. 10, No. 37; Oct. 1976; pp. C4-23-C427.

Stefan Lai et al.; "OUM—A 180 nm Nonvolatile Memory Cell Element Technology for Stand Alone and Embedded Applications;" IEEE, IEDM Tech Digest, 2001, pp. 803-806.

Maxim Lebedev et al.; "Effect of Thickness on the Piezoelectric Properties of Lead Zirconate Titanate Films Fabricated by Aerosol Deposition Method;" Jpn. J. Appl. Phys. vol. 41, 2002, pp. 6669-6673.

R. Lengsdorf et al.; "The observation of the insulator-metal transition in EuNio3 under high pressure;" Journal of Physics: Condensed Matter, 16; 2004; pp. 3355-3360.

J. Li, et al., "Ultrafast polarization switching in thin-film ferroelectrics," Applied Physics Letters, 84, No. 7, 2004, p. 1174-1176.

C. Liu et al.; "Pressure-induced insulator-conductor transition in a photoconducting organic liquid-crystal film;" Letter to Nature, vol. 418; Jul. 11, 2002; pp. 162-164.

S.S. Lu et al.; "Piezoelectric field effect transistor (PEFET) using In0.2Ga0.8As/Al0.35/In0.2Ga0.8As/GaAs strained layer structure on (111)B GaAs substrate;" Electronic Letters May 12, 1994 vol. 30 No. 10; pp. 823-825.

Jon Maimon et al.; "Chalcogenide-Based Non-Volatile Memory Technology;" IEEE Aerospace Conf. Proceedings, 2001, pp. 2289-2294.

Morgan Advanced Materials, [online]; [retrieved on Oct. 23, 2013]; retrieved from the Internet http://www.morganelectroceramics.com/materials/piezoelectric/single-crystal-piezo/ Morgan Technical Ceramics Electroceramics, "Single Crystal Piezo," Advanced Piezoelectric Materials, 2009, pp. 1-2.

Y. Matsumuro, Y. Oishi, W.B. Wu, and M. Okuyama, "Preparation of PMN-PT Files by Laser Ablation Method," Integrated Ferroelectrics, 20, 1998, pp. 95-105.

A. Yukikuni et al.; "Pressure induced insulator-methal transition in hexagonal BaTi03;" Journal of Physical Society of Japan; 2004; Abstract Only, pp. 1-2.

I. Mayergotz, et al. "Hysteresis in Piezoelectric and Ferroelectric Materials," The Science of Hysteresis, vol. 3, Only Chapter 4, 2005, pp. 1-129.

F. Nakamura, et al., "From Mott Insulator to Ferromagnetic Metal: A pressure Study of CA2RuO4," Phys Rev B , vol. 65, No. 22, Article 220402, 2002, pp. 1-4.

D. M. Newns et al., "High Response Piezoelectric and Piezoresistive Materials for Fast, Low Voltage Switching : Simulation and Theory of Novel Transduction Physics at the Nanoscale," Advanced Materials, vol. 24, 2012, pp. 3672-3677.

D. M. Newns et al., "A Low-Voltage High-Speed Electronic Switch Based on Piezoelectric Transduction," J. Appl. Phys., vol. 111, No. 8, 2012, 084509, 18 pages.

B. Elmegreen et al., "Piezoelectronic Memory," U.S. Appl. No. 13/719,965, filed Dec. 19, 2012.

R. Yu et al., "GaN Nanobelts Based Strain-Gated Piezotronic Logic Devices and Computation," ACS Nano, Publication Date (Web): Jun. 18, 2013, pp. 1-7.

Sharath Sriram et al.; ARNAM 2007 Annual Workshop, "Measurement of High Piezoelectric response of strontium-doped lead zirconate titanate thin films using a nano-indenter," Abstract, 2007, pp. 1-1.

S. Sriram et al.; "The effect of post-deposition cooling rate on the orientation of piezoelectric (Pb0.92Sr0.08) (Zr0.65Ti0.35)O3 thin films deposited by RF magnetron sputtering;" Semiconductor Science and Technology 21; 2006; pp. 1236-1243.

S. Sriram et al.; "Measurement of high piezoelectric response of stronium-doped lead zirconate titanate thin films using a nanoindenter;" Journal of Applied Physics 101, 104910 (2007), pp. 101-105.

Hidekuni Takao et al., "Stress-Sensitive Differential Amplifiers Using Piezoresistive Effects of MOSFETs and Their Application to Three-Axial Accelerometers," Elsevier, Sensors and Actuators—A Physical; 65; pp. 61-68; 1998.

T. Theis and P. Solomon, "In quest of the •Next Switch: Prospects for greatly reduced power dissipation in a successor to the silicon field-effect transistor," Proceedings of the IEEE, vol. 98, No. 12, pp. 2005-2014, Dec. 2010.

S. Tomic et al.; "Pressure-Induced Metal-to-Insulator Phase Transitions in the Organic Conductor (2,5 DM-DCNQI) 2Cu;" Europhysics Letters, 5 (6); Mar. 15, 1988; pp. 553-558.

(56) References Cited

OTHER PUBLICATIONS

Scott Tyson et al.; "Nonvolatile, High Density, High Performance Phase Change Memory;" IEEE Aerospace Conf. Proceedings, 2001, pp. 385-390.

Arturas Ulcinas et al.; "Investigation of microstructure and piezoelectric properties of Zr- and Sm-doped PbTiO3 nanostructured thin films derived by sol-gel technology;" Sensors and Actuators B 109, 2005, pp. 97-101.

X. Wang et al.; "Piezoelectric Field Effect Transistor and Nanoforce Sensor Based on a Single ZnO Nanowire;" Nano Letters 2006 vol. 6, No. 12; pp. 2768-2772.

F. Xu et al.; "Longitudinal piezoelectric coefficient measurement for bulk ceramics and thin films using pneumatic pressure rig;" Journal of Applied Physics vol. 86, No. 1, Jul. 1, 1999; pp. 588-594.

Y. Yamashita et al.; "Can relaxor piezoelectric materials outperform PZT?(Review);" IEEE; 1996; 71-78.

Bruce G. Elmegreen, et al., "Piezoelectronic Devices with Novel Force Amplification" U.S. Appl. No. 61/950,343, filed Mar. 10, 2014.

A. Jayaraman, "Pressure-volume relationship and pressure-induced electronic and structural transformations in Eu and Yb monochalcogenides," Physical Review B, vol. 9, No. 6, Mar. 15, 1974, pp. 2513-2520.

A. Jayaraman, et al., "Study of the Valence Transition in Eu-, Yb-, and Ca-substituted SmS under High Pressure and some Comments on other Substitutions," Physical Review B, vol. 19, No. 8, Apr. 15, 1979, pp. 1-8.

Xu et al., "Dielectric hysteresis from transverse electric fields in lead zirconate titanate thin films", Applied Physics Letters, vol. 74, No. 23, Jun. 7, 1999, pp. 3549-3551.

Brian A. Bryce, et al., "Integrating a Piezoresistive Element in a Piezoelectronic Transistor" U.S. Appl. No. 14/529,886, filed Oct. 31, 2014.

Brian A. Bryce, et al., "Passivation and Alignment of Piezoelectronic Transistor Piezoresistor" U.S. Appl. No. 14/529,929, filed Oct. 31, 2014.

Brian A. Bryce, et al., "Piezoelectronic Transistor With Co-Planar Common and Gate Electrodes" U.S. Appl. No. 14/529,834, filed Oct. 31, 2014.

Bruce G. Elmegreen, et al. "Piezoelectronic Device With Novel Force Amplification" U.S. Appl. No. 14/577,279, filed Dec. 19, 2014.

Bruce G. Elmegreen, et al., "Low Voltage Transistor and Logic Devices With Multiple, Stacked Piezoelectronic Layers" U.S. Appl. No. 14/468,822, filed Aug. 26, 2014.

Samal et al., "Low-temperature (=200° C.) plasma enhanced atomic layer deposition of dense titanium nitride thin films", Journal of Vacuum Science & Technology A, vol. 31, No. 1, 2013, pp. 1-8.

D. Xue, et al., "Elastic, piezoelectric, and dielectric properties of Ba(Zr0.2Ti0.8)O3-50(Ba0.7Ca0.3)TiO3 Pb-free ceramic at the morphotropic phase boundary," Journal of Applied Physics, 109, 054110, 2011, pp. 1-7.

D.C. Gupta, et al., "Pressure induced magnetic, electronic and mechanical properties of SmX (X=Se, Te)," Journal of Physics: Condensed Matter, 21, 2009, 436011, pp. 1-11.

S.J. Gross, "Micromachined Switches and Cantilever Actuators Based on Piezoelectric Lead Zirconate Titanate (PZT)," A Thesis in Electrical Engineering, PhD Dissertation, The Pennsylvania State University, Aug. 2004, pp. 1-156.

R. Polcawich, et al., "Surface Micromachined Microelectromechanical Ohmic Series Switch Using Thin-Film Piezoelectric Actuators," IEEE Transactions on Microwave Theory and Techniques, vol. 55, No. 12, Dec. 2007, pp. 2642-2654.

G. M. Rebeiz, "RF Mems Switches: Status of the Technology," Transducers, The 12th International Conference on Solid State Sensors, Actuators and Microsystes, Jun. 8-12, 2003, pp. 1726-1729.

Hu Cao, et al., "Elastic, Piezoelectric, and Dielectric Properties of 0.58Pb(Mg1/3Nb2/3) O3-0.42PbTiO3 Singel Crystal," Journal of Applied Physics, vol. 96, No. 1, Jul. 1, 2004, pp. 1-6.

Hu et al., "Converse Piezoelectric Effect Induced Transverse Deflection of a Free-Standing ZnO Microbelt", Nano Letters, vol. 9, No. 7, 2009, pp. 2661-2665.

J. Park, et al., "Direct Observation of Nanoparticle Superlattice Formation by Using Liquid Cell Transmission Electron Microscopy," ACS Nano, vol. 6, No. 3, Feb. 2012, pp. 2078-2085.

Matthew W. Copel, et al., "Piezoelectronic Switch Device for RF Applications" U.S. Appl. No. 14/529,380, filed Oct. 31, 2014.

P.M. Solomon, et al., "The PiezoElectronic Switch: a Path to Low Energy Electronics," IEEE, 2013, pp. 1-2.

* cited by examiner

Polarizing FE

Depolarizing FE

|  | w | b |
|---|---|---|
| Write 1 | H | H |
| Write 0 | H | 0 |
| No Write | 0 | ? |
| Read | H | H or ? |
| Standby | 0 | 0 |

Figure 6

FE Material 1

FE Material 2

US 9,251,884 B2

NON-VOLATILE, PIEZOELECTRONIC MEMORY BASED ON PIEZORESISTIVE STRAIN PRODUCED BY PIEZOELECTRIC REMANENCE

STATEMENT OF GOVERNMENT INTEREST

This invention was made with Government support under Contract No.: N66001-11-C-4109 awarded by Defense Advanced Research Projects Agency (DARPA). The Government has certain rights in this invention.

BACKGROUND

The present invention relates generally to integrated circuit devices and, more particularly, to a non-volatile, piezoelectronic memory based on piezoresistive strain produced by piezoelectric remanence.

Complementary Field Effect Transistors (FETs) support the standard computer architecture (CMOS) currently used in logic and memory. FETs exploit high channel mobility to control few-carrier currents electrostatically. However, limitations in this highly successful technology are appearing at current and future device scales. In particular, the inability to operate with power supplies significantly below 1 volt (V) limits device speed because faster clock speeds imply unacceptably high power consumption. Thus, it would be highly desirable to develop new switches and memories enabling computer architectures operable at low voltages/powers and high speeds.

SUMMARY

In an exemplary embodiment, a nonvolatile memory storage device, includes a ferroelectric (FE) material coupled with a piezoresistive (PR) material through an inherent piezoelectric response of the FE material, wherein an electrical resistance of the PR material is dependent on a compressive stress applied thereto, the compressive stress caused by a remanent strain of the FE material resulting from a polarization of the FE material, such that a polarized state of the FE material results in a first resistance value of the PR material, and a depolarized state of the FE material results in a second resistance value of the PR material.

In another embodiment, a nonvolatile memory cell includes a storage transistor coupled to an access transistor, the storage transistor comprising a first ferroelectric (FE) material coupled with a first piezoresistive (PR) material through an inherent piezoelectric response of the first FE material, wherein an electrical resistance of the first PR material is dependent on a compressive stress applied thereto, the compressive stress caused by a remanent strain of the first FE material resulting from a polarization of the first FE material, such that a polarized state of the first FE material results in a first resistance value of the first PR material, and a depolarized state of the FE material results in a second resistance value of the first PR material that is higher than the first resistance value, wherein the first FE material is disposed between first and second electrodes, and the first PR material is disposed between the second electrode and a third electrode; wherein the first FE material is polarized by initial application of a voltage across the first FE material to result in an initial polarization $D_s$, and thereafter by removal of the voltage to leave the first FE element with a remanent polarization $D_r$ and a remanent strain $S_r$; and wherein the first FE material is depolarized and the remanent strain removed by applying an alternating voltage of decreasing amplitude across the first FE material.

In another embodiment, a multibit, nonvolatile memory storage device includes a first ferroelectric (FE) material and a second FE material coupled with a piezoresistive (PR) material through an inherent piezoelectric response of the first FE material and second FE material, and arranged in a single stack, wherein an electrical resistance of the PR material is dependent upon on a compressive stress applied thereto, the compressive stress caused by a remanent strain of the first FE material and the second FE material resulting from a polarization of the first FE material and a polarization of the second FE material such that the PR material is set to assume one of a first resistance value, a second resistance value, a third resistance value of the PR material, and a fourth resistance value.

BRIEF DESCRIPTION OF THE SEVERAL VIEWS OF THE DRAWINGS

Referring to the exemplary drawings wherein like elements are numbered alike in the several Figures:

FIG. 6 is a table that illustrates read and write operations for the memory element of FIG. 5;

DETAILED DESCRIPTION

Figure 1:
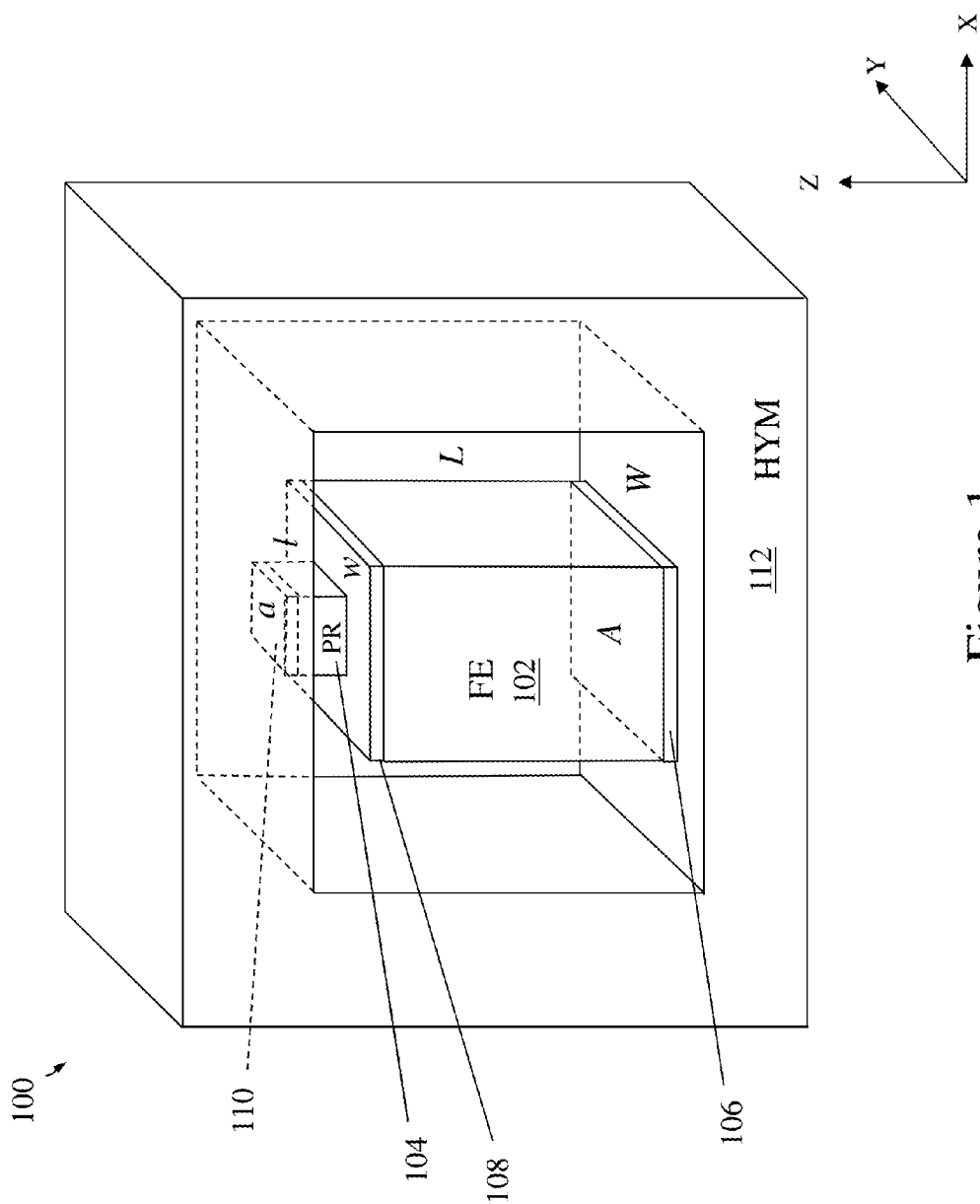
FIG. 1 is a perspective view of an exemplary memory storage device in accordance with an exemplary embodiment.

Disclosed herein are embodiments of a non-volatile, ferroelectric memory having a piezoresistive read capability (FePZRAM) which makes the device compatible with piezoelectronic, low-voltage switching technology. Referring initially to FIG. 1, there is shown a perspective view of an exemplary memory storage device 100 in accordance with an exemplary embodiment. The memory storage device 100 includes a ferroelectric (FE) element 102 such as PZT (Pb [$Zr_x Ti_{1-x}$]$O_3$) coupled with a piezoresistive (PR) element 104, such as SmSe. FE materials are a subset of piezoelectric (PE) materials which, after being driven to a saturation voltage by an external source, retain a remanent polarization after removal of the external voltage source. Thereby, a remnant strain state, with respect to the unpolarized state, is also achieved within the FE material.

The FE element 102 is disposed between a gate contact (electrode) 106 and a common contact 108, and the PR element 104 is disposed between the common contact 108 and a sense contact 110. A high yield strength medium serves as a mechanical clamp 112 around the memory structure. As further illustrated in FIG. 1, the FE element 102 has a cross sectional area (A) along the x-y axes and a thickness (L) along the z-axis. The PR element 104 has a cross sectional area (a) along the x-y axes and a thickness (l) along the z-axis.

Figure 2A:
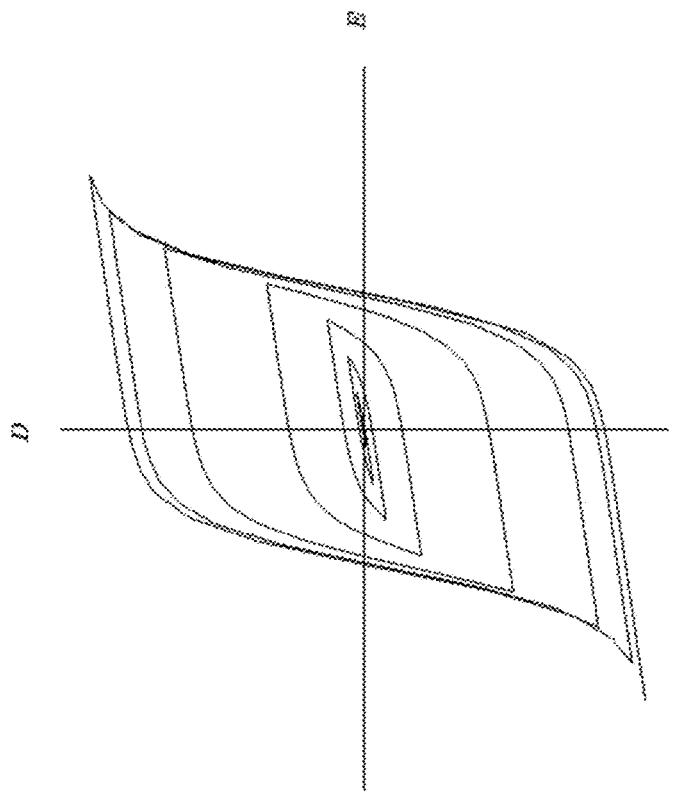
FIG. 2A is a graph illustrating hysteretic polarization of the ferroelectric (FE) element of the memory storage device of FIG. 1.
Figure 2B:
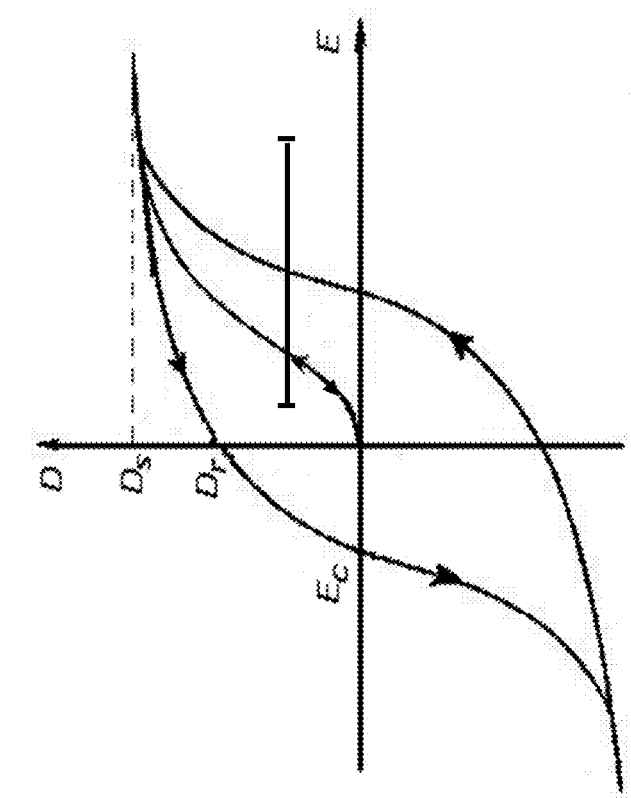
FIG. 2B is a graph illustrating depolarization of the FE element of the memory storage device of FIG. 1.

The ferroelectric element 102 is operated in two states. First, in a "Bit 1" state, the FE element 102 is polarized in a direction parallel to the z-axis, and thus is elongated along the same axis. In a "Bit 0" state, the FE element 102 is unpolarized, and thus not elongated. The FE 102 is polarized (as shown in the graph of FIG. 2A) by applying a suitable voltage across the gate-common pair of contacts 106/108 to initially bring the polarization to $D_s$, and thereafter then turning the applied voltage off to leave the FE element 102 with both a remanent polarization $D_r$ and a remnant strain $S_r$. As shown in the graph of FIG. 2B, the FE element 102 may be depolarized by applying an alternating voltage of steadily decreasing amplitude.

Figure 2C:
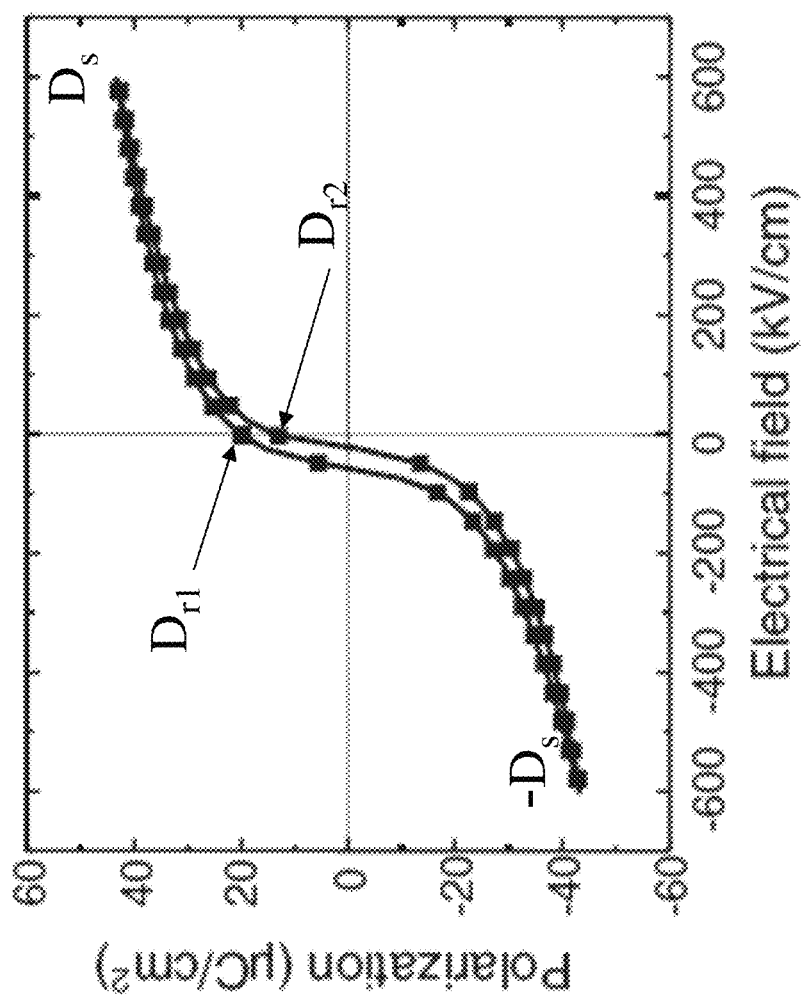
FIG. 2C is a graph illustrating polarization and depolarization of the FE element of FIG. 1 in an imprinted state, according to another embodiment.

In an alternative embodiment, the FE element 102 may be placed in an imprinted state, as shown in the graph of FIG. 2C, with two positive remanent polarizations $D_{r1}$ and $D_{r2}$. To go from polarization $D_{r2}$ to $D_{r1}$, an electric field is applied to bring the polarization to $D_s$ and then the electric field is reduced to zero leaving the polarization at $D_{r1}$. To go from polarization $D_{r1}$ to $D_{r2}$, a negative electric field is applied to bring the polarization to $-D_s$ and then the field is increased to zero leaving the polarization at $D_{r2}$. It should be noted that the embodiments described below are specific to the non-imprinted case in which polarization is illustrated as in FIG. 2A and depolarization is illustrated as in FIG. 2B.

An exemplary switching time for the FE element 102 may be on the order of 10's of picoseconds (ps) for a thin FE film and voltages on the order of several tens of millivolts (mV). Switching occurs by the motion of a domain wall at the speed v=2.4×10$^{-4}$E·m/s for an electric field E in V/m. For V=0.05 V and thickness L=30 nm (FIG. 1), this speed is 400 m/s and the propagation time is 75 ps.

Figure 3B:
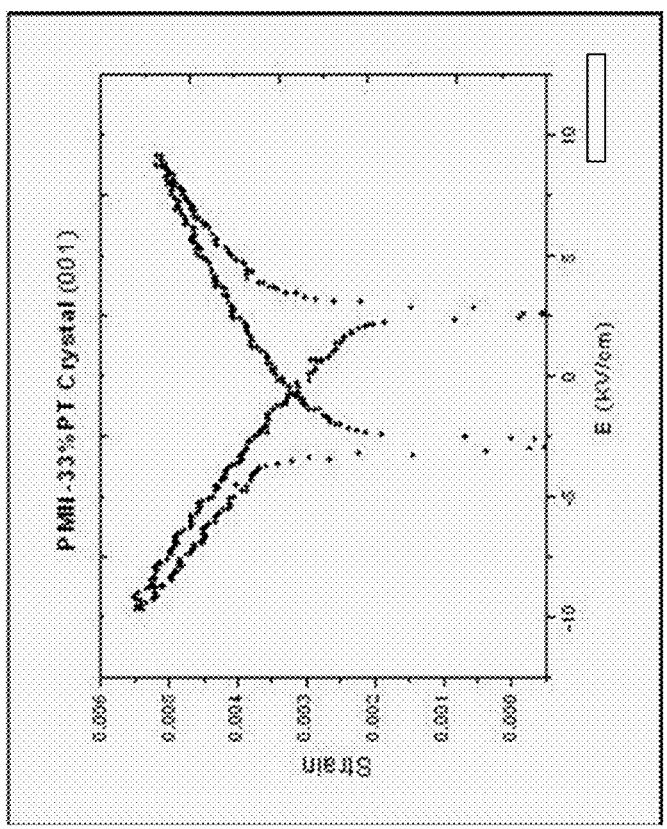
FIG. 3B is a graph that illustrates the strain of the FE material transverse to its thickness versus electric field.
Figure 3A:
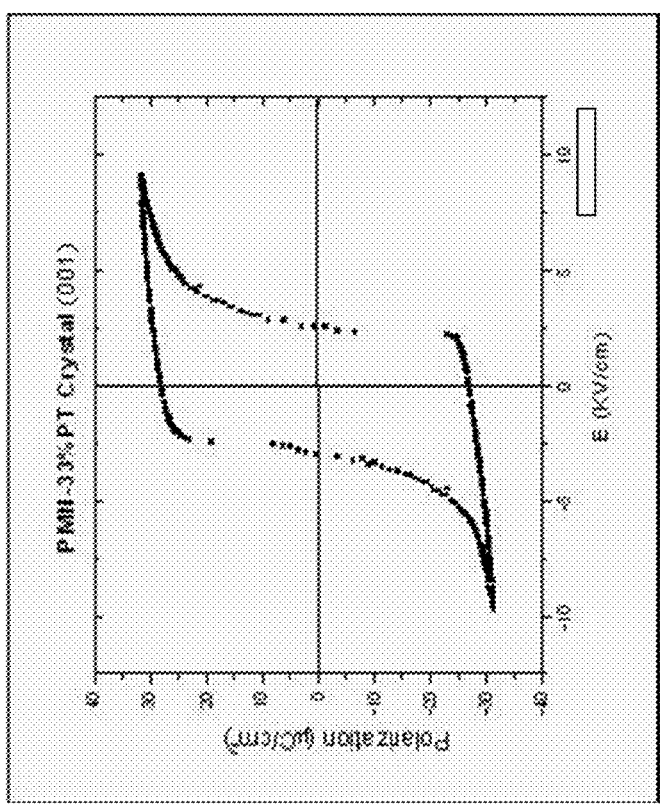
FIG. 3A is a graph illustrating polarization p vs. electric field E for a FE material, PMN-33% PT.

FIG. 3A illustrates a plot of polarization p vs. electric field E for a FE material, PMN-33% PT, which is also a piezoelectric material (an essential additional property utilized in the present embodiments). In FIG. 3B, the graph illustrates the strain transverse to its thickness versus electric field. It is seen that by applying a moderate electric field, e.g., 7 kV/cm (equivalent to 0.07 V across a 100 nm thick film), the film is electrically polarized and a strain S in the film transverse to its thickness of 0.003 can be produced on relaxing back to zero field. This zero-field strain is used to store a bit.

When polarized, the expansive strain acting on the FE element 102 is used to compress the PR element 104, which is in contact with the FE element 102, and constrained by the surrounding rigid clamp 112 to cause compression rather than expansion of the whole structure. The compression of the PR element 104 due to the "Bit 1" polarization of the FE element 102 is used to provide a piezoresistive read signal through the sense and common contacts 110, 108.

Figure 4:
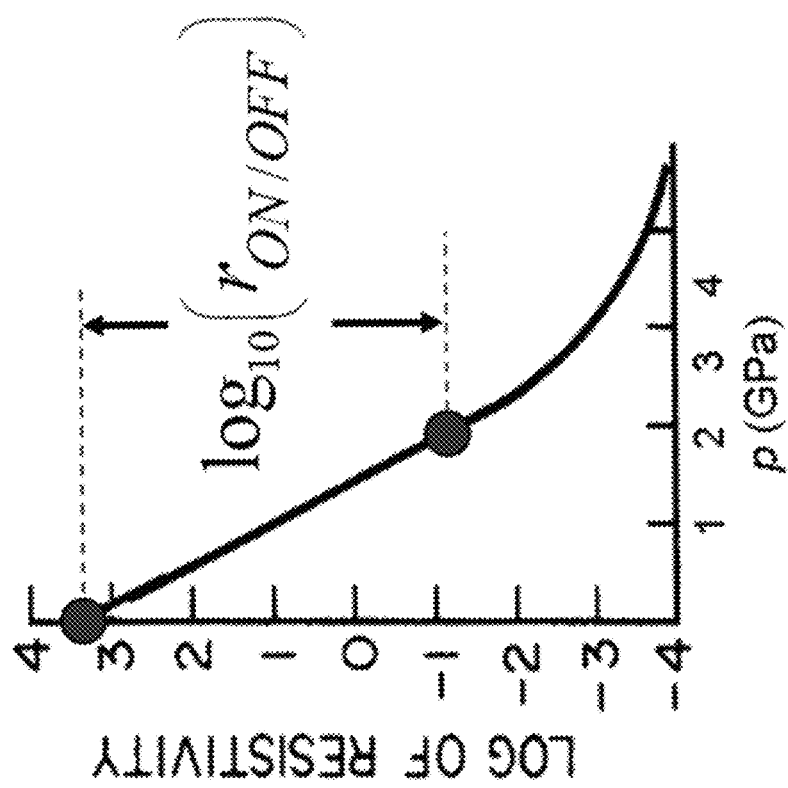
FIG. 4 is a graph that illustrates the resistive response to pressure in a SmSe piezoresistive (PR) medium.

Referring now to FIG. 4, there is shown a graph that illustrates the resistive response to pressure in a proposed PR medium, SmSe, which undergoes a large change in resistivity under an applied GPa-magnitude pressure. Other materials which may be suitable in this regard include, for example, SmS, SmTe, TmTe, $CaRuO_4$, $Ni(S_{1-x}Se_x)_2$, and $V_2O_3$ doped with 4% Cr.

An approximate expression for the stress in the PR due to the polarization-induced strain in the FE is:

$$T_{PR} = \frac{S(p)}{\frac{l}{LY_{PR}} + \frac{a}{AY_{FE}}}$$

Here, $T_{PR}$ is the stress in the PR, S(p) is the remanent strain in the FE due to polarization p, the dimensions and areas (l, L, a and A) are as described in FIG. 1, $Y_{PR}$ and $Y_{FE}$ are the Young's moduli of the PR element 104 and FE element 102, respectively. As an example, if it is assumed that the thickness ratio l/L is ⅒, and the area ratio a/A is ¹⁄₁₆, and Young's moduli are $Y_{PR}$=100 GPa, $Y_{FE}$=20 GPa, then using the FIG. 3B example with S(p)=0.003, $T_{PR}$=0.727 GPa.

Referring to the exemplary PR response in FIG. 4, it is seen that a pressure of 0.7 GPa will produce a change in resistivity of approximately $\log_{10} r_{ON/OFF}$=1.7 orders of magnitude, which is more than sufficient to present a clear read signal.

Figure 5:
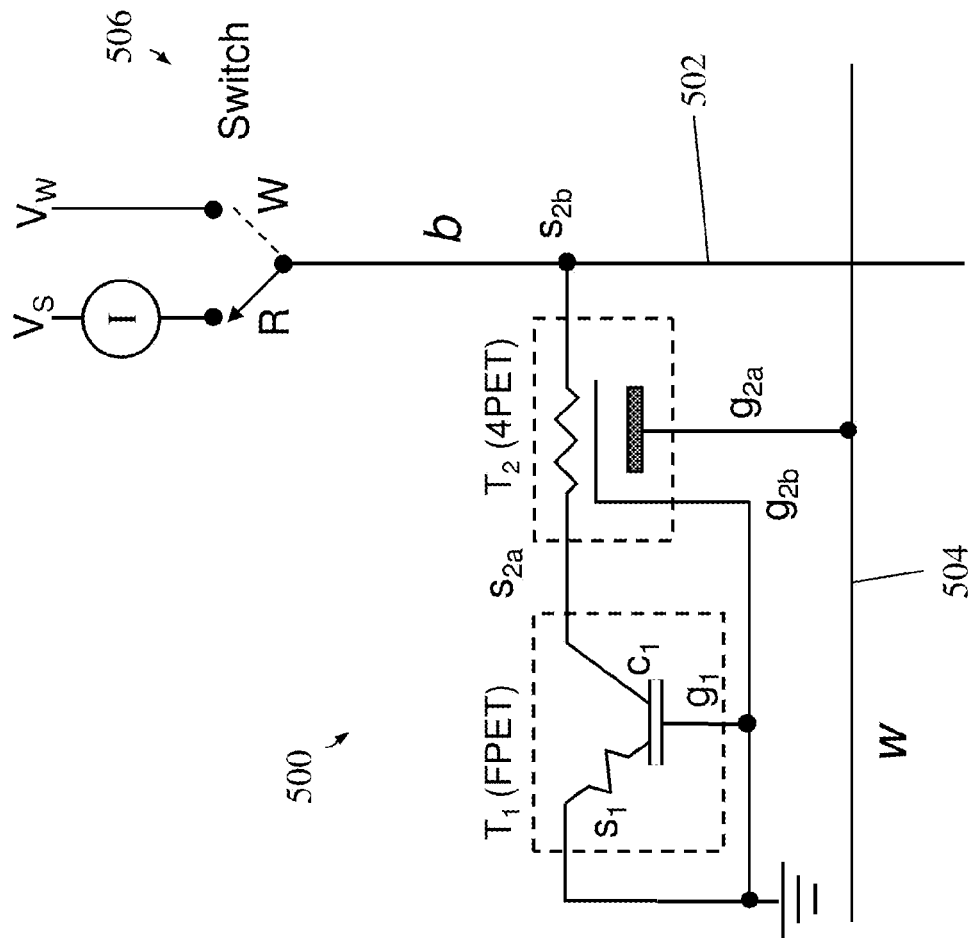
FIG. 5 is a schematic diagram of a two transistor memory cell that may be used in a cross-point memory matrix to read and write a bit using the storage element design of FIG. 1, in accordance with an exemplary embodiment.

Referring now to FIG. 5, there is shown a schematic diagram of an individual, two transistor memory cell 500 that may be used in a cross-point memory matrix to read and write a bit using the storage element design of FIG. 1. The memory cell 500 includes a pair of piezoelectronic transistors (PETs), $T_1$ and $T_2$. Both PETs are surrounded either individually or together by a High Young's—modulus Material (HYM) (not specifically shown in FIG. 5). Transistor $T_1$ serves as the storage element and corresponds to the device 100 illustrated in FIG. 1, while transistor $T_2$ serves as an access transistor for $T_1$, and in an exemplary embodiment is implemented as a four-terminal PET.

In brief, the 4-terminal PET $T_2$ includes a piezoelectric (PE) crystal material in lieu of the FE material of the storage transistor $T_1$. In addition, instead of being disposed between a gate electrode and a common electrode, the PE material of $T_2$ is disposed between a pair of gate electrodes. A low permittivity insulator layer (not shown) separates the one gate electrode from a first sense electrode. Effectively, the common electrode of the 3-terminal configuration is split into a second gate electrode and second sense electrode for a 4-terminal configuration. Additional details concerning 4-terminal PET devices may be found in U.S. application Ser. No. 13/719,965, the contents of which are incorporated herein by reference in their entirety.

The memory element 500 is coupled to a pair of control lines, b (bit line) 502 and w (word line) 504. The gate electrode ($g_1$) and the sense electrode ($s_1$) of the ferroelectric PET (FPET) storage transistor $T_1$ are coupled to ground. The common electrode ($c_1$) of the FPET storage transistor $T_1$ is coupled to a first sense electrode ($s_{2a}$) of the 4PET access transistor $T_2$, while a second sense electrode ($s_{2b}$) of the 4PET access transistor $T_2$ is coupled to the bit line 502. A first gate electrode ($g_{2a}$) of the 4PET access transistor $T_2$ is coupled to the word line 504, and a second gate electrode ($g_{2b}$) of the 4PET access transistor $T_2$ is coupled to ground. A switch 506 may be included in the peripheral logic to couple to separate read (sense) and write voltages ($V_s$, $V_w$) for the bit line b. The switch 506 may also be implemented using a PET device in lieu of an FET device. Internally, the gate electrode ($g_1$) of FPET $T_1$ is connected to one side of the FE capacitor, with the other side of the capacitor representing the common electrode ($c_1$). The resistor symbol of FPET $T_1$ represents the PR material connected between the common and sense contacts.

FIG. 6 is a table that illustrates read and write operations for the memory element 500 of FIG. 5. In a standby state, both the bit line 502 (b) and the word line 504 (w) are grounded (i.e., set to 0 volts). For a read operation, the bit line 502 is connected via a current sensor (I) to a small sense voltage source $V_s = \epsilon$. A voltage H is applied to the word line, the effect of which is to turn $T_2$ ON (i.e., the access transistor $T_2$ couples the storage transistor $T_1$ to the bit line 502). The current through the sensor (I) detects the bit state of $T_1$; specifically, a large current indicates that the PR of $T_1$ is in the compressed low resistance state characteristic of a bit 1 value, while a low current indicates that the PR of $T_1$ is in the uncompressed high resistance state of a bit 0 value.

In a write mode of operation, the switch 506 uncouples the bit line 502 from the small sense voltage source $V_s$ and couples the bit line 502 to a write voltage source V. To write a 1 to the storage transistor $T_1$, the voltage on the word line 504 is raised to H to turn $T_2$ ON. A constant write voltage H is also applied to the bit line 502 to polarize the FE material of the storage transistor $T_1$, and is thereafter turned off. To write a 0 to the storage transistor $T_1$, the applied write voltage on the bit line 502 is an oscillatory voltage (symbolized by ~ in FIG. 6) with a gradually decreasing amplitude. It is not necessary that the FE be completely depolarized to represent bit 0, so long as the low polarization state results in a PR resistance of the storage transistor $T_1$ being distinguishable from the high polarization state, which again is facilitated by the exponential dependence of PR resistance on pressure (FIG. 4).

FIG. 6 also illustrates a "no write" state, in which the bit line 502 may be used for writing another memory cell (not shown) on the bit line 504 but associated with a different word line. So long as the voltage on the word line 504 is 0, there is no access to the storage transistor $T_1$ since the access transistor $T_2$ remains in an OFF state.

Memory matrix operation defines conditions on PET design. To detect the ON state, the condition $R_{2,ON} \ll R_{1,ON} \ll R_{1,OFF}$ would be desirable. To detect a 1 bit in an enabled row, which is a row with $T_2$ in the low-resistance state, $R_{2,on}$, the resistance in $T_1$, which is $R_{1,on}$, must be less than the parallel sum of all the off resistances in the $T_2$ 4 PETS that are in the other rows. In this way, the current through the bit to be read dominates the combined leakage current from the other rows. If N is the number of rows, then this readability condition is $R_{1,on} \ll R_{2,off}/N$.

Leakage current through the piezoelectric, which is nominally a capacitor, should be minimized to avoid excessive energy dissipation. The leakage current through a PMN-PT piezoelectric with an electric field of $4 \times 10^6$ V/m equals $10^{-5}$ A/cm$^2$. This value is also expected for a design where the applied voltage is about 0.1 V and the PE thickness is about 25 nm. With a leakage current of $10^{-5}$ A/cm$^2$ for each PET, a memory with $10^9$ PETs, each with an area of $(30 \text{ nm})^2$, has a total leakage current of $10^{-7}$ A, or a total leakage power of $10^{-8}$ Watts. This is negligible compared to the other power dissipated.

Figure 7:
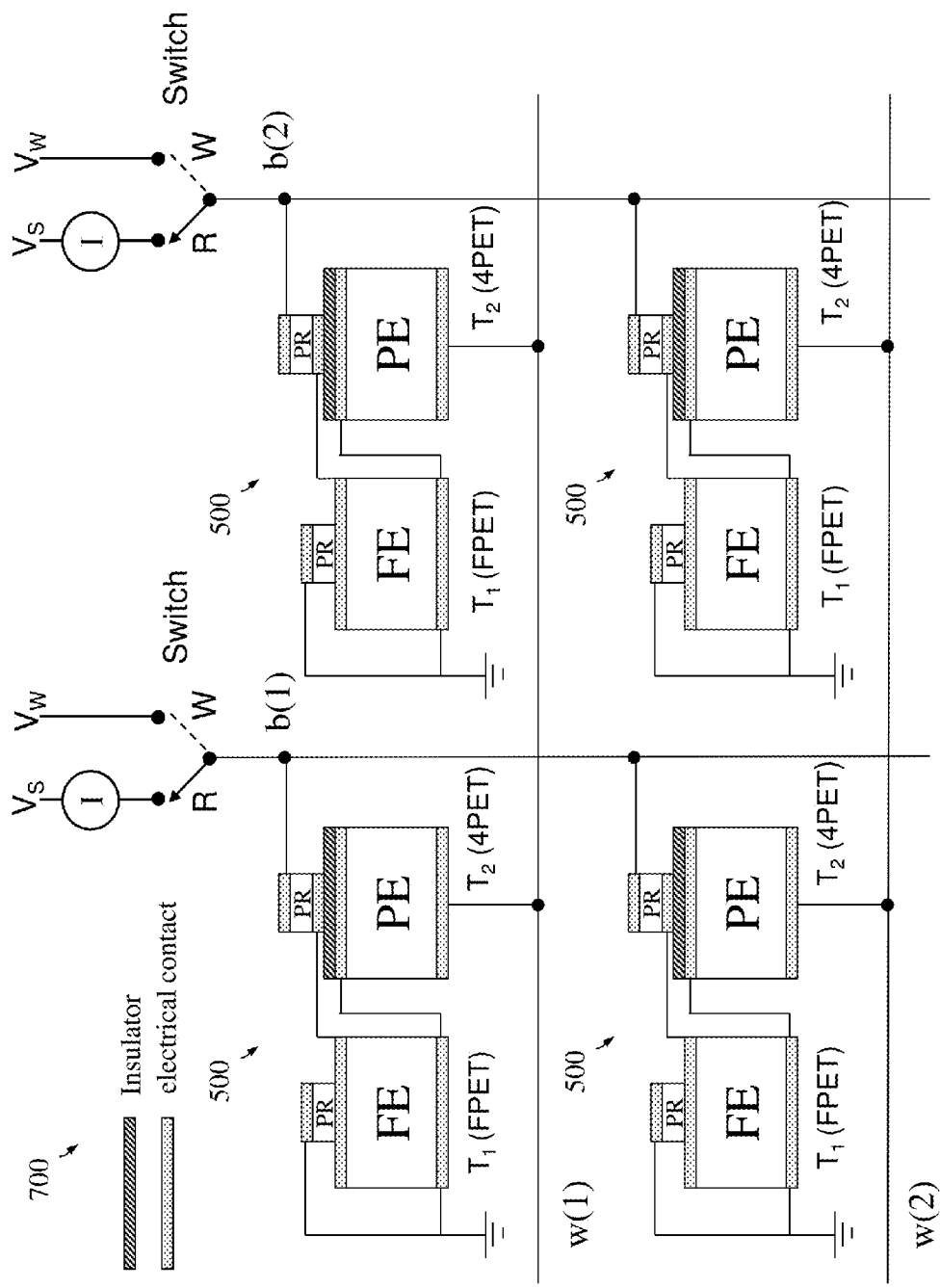
FIG. 7 is a schematic diagram of a memory matrix utilizing the type of memory elements shown in FIG. 5.

FIG. 7 is a schematic diagram of a memory matrix 700 utilizing the type of memory elements 500 shown in FIG. 5. Assuming the memory matrix 700 of FIG. 7 is M×N, with M~N~1000, and a lithography scale of 10 nm, the amount of energy used to charge the M bit lines (b(1), b(2), etc.) is larger than the amount of energy used to charge a word line (w(1), w(2), etc.). More specifically, the energy is dominated by the wiring capacitance and is on the order of about $1 \times 10^{-13}$ J for 1000 bit lines. This also gives a negligible contribution of $1 \times 10^{-4}$ Watts to the power at an input bit rate of 1 Gb/s per bit line. For sources of equal resistance, the charging time of the word line is longer than that of the bit line, which is dominated by the input capacitances of the 4-PETs, and is on the order of about $1 \times 10^{-16} MR_w$ where $R_w$ is the word line source impedance.

Figure 8:
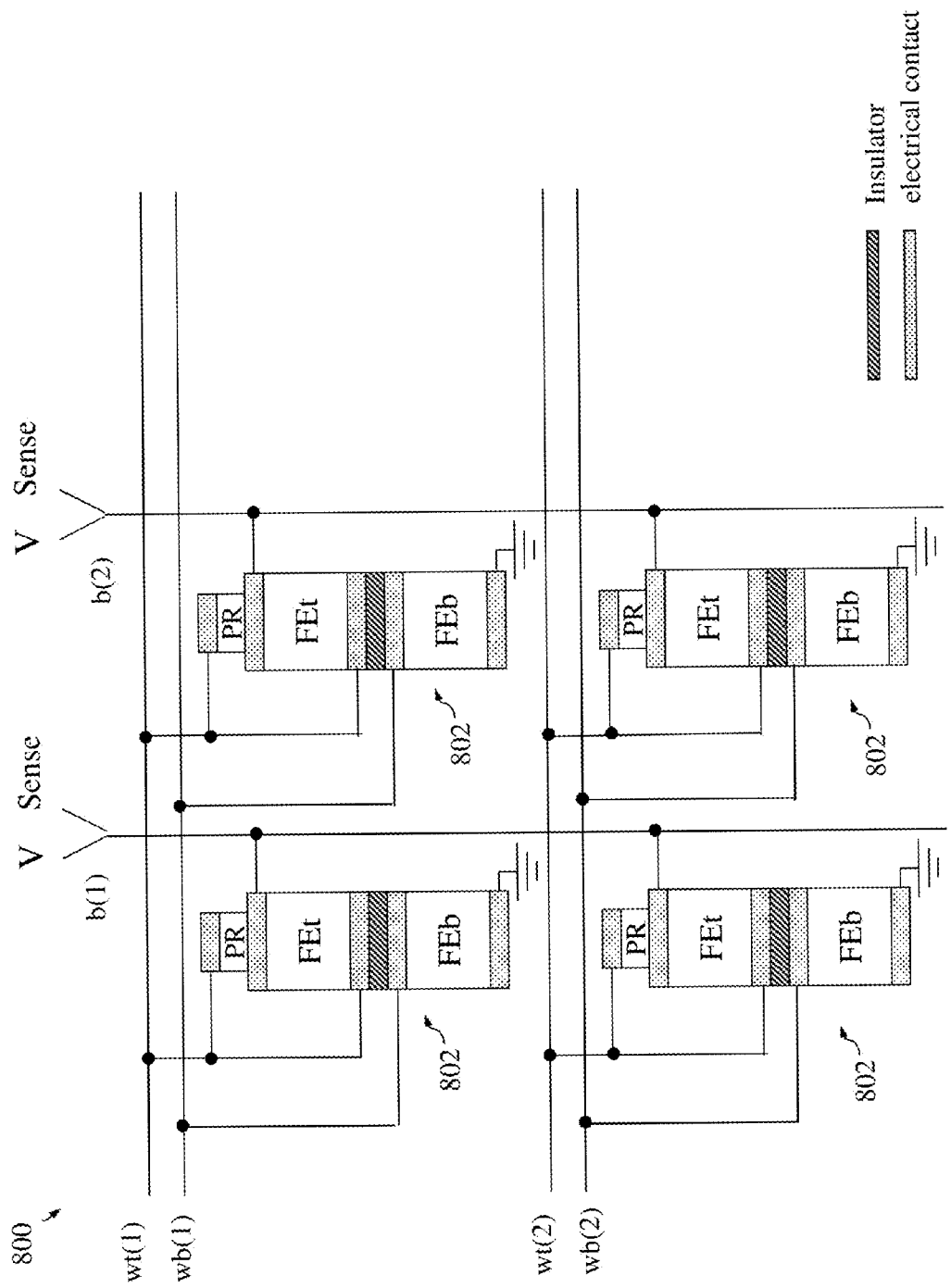
FIG. 8 is a schematic diagram of a cross-point FePZRAM matrix that utilizes a single FE-PR stack per memory element, in accordance with another embodiment.

Referring now to FIG. 8, there is shown a schematic diagram of a cross-point FePZRAM matrix 800, in accordance with another embodiment. This embodiment utilizes just a single FE-PR stack per memory element 802 (and surrounded by a HYM, not shown), which allows for approximately 4 times the density on a chip with respect to the memory element 500 illustrated in FIGS. 5 and 7. Each memory element 802 in FIG. 8 includes a bottom ferroelectric layer (FEb) with opposing electrical contacts on each side, in mechanical but insulated contact with a top ferroelectric layer (FEt) that also has two separate electrical contacts on opposing sides thereof. In addition, a top PR layer is in mechanical contact with the top ferroelectric layer (FEt), wherein the top PR layer also has electrical contacts on opposing sides thereof, one of which may be shared with the adjacent electrical contact of FEt. There are two word lines, wt(n) and wb(n) (for n equal to rows 1, 2, 3, etc.), providing electrical contact to each row in the matrix 800, as well as one bit line, b(m) (for m equal to columns 1, 2, 3, etc.) providing electrical contact to each column. Each word line wb(n) connects to the top electrical contact on FEb, the other contact of which is grounded, and each word line wt(n) connects to the bottom electrical contact of FEt and to the top electrical contact of the PR. Each bit line b(m) contacts the conducting layer between the associated FEt and PR.

Figure 9:
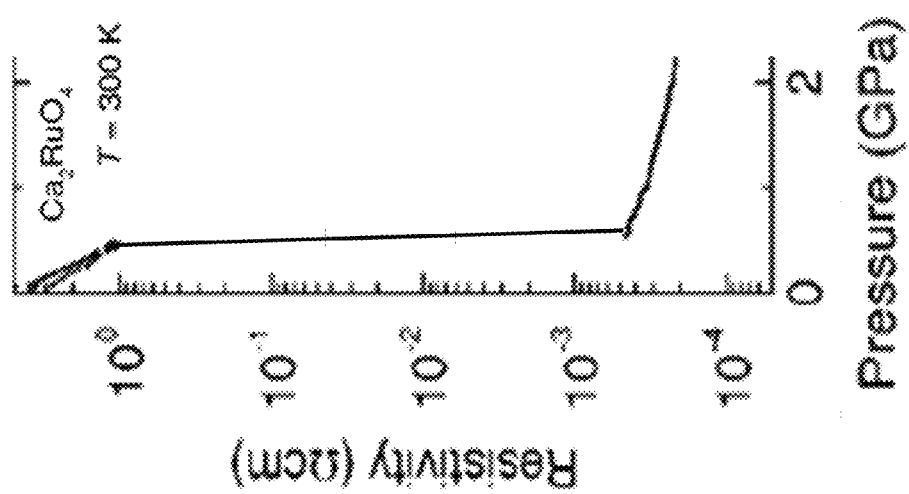
FIG. 9 is a pressure-resistance curve for a $Ca_2RuO_4$ PR material.

Each memory element 802 shown in FIG. 8 utilizes a type of PR that has a slowly declining resistance with increasing pressure at low pressure, and then a steeply declining resistance with increasing pressure at high pressure, as shown in the pressure-resistance curve of FIG. 9. Specifically, FIG. 9 is a pressure-resistance curve for the material $Ca_2RuO_4$. As is illustrated, a half compression of the PR reduces its resistance by only a small amount, while a full compression reduces it by a large amount.

Referring again to FIG. 8, operation of the memory elements 802 may be understood as follows. Each bottom FEb is controlled by the associated bottom word line wb(n) and is placed in a non-polarized state for all write operations and for all read operations in any other row but its own. However, bottom word line wb(n) places FEb in a polarized state when the n$^{th}$ row is being read. This operation of polarizing and unpolarizing FEb takes the place of the row-enabling switch ($T_2$) in the memory element of FIG. 5. The top word lines wt(n), in conjunction with the bit lines b(m), control the value of the bit in the (m,n) memory unit by setting FTt(m,n) to a polarized or unpolarized state. This write operation can be done simultaneously for all memory elements in the row.

The read operation is implemented by first setting all of the bottom ferroelectrics in a row, FEb, to a polarized state, thereby compressing the PR halfway. Each FEb in the non-read rows remains unpolarized. A small voltage E is then applied to the top word line wt(n) for row n, and the bit lines are set to zero voltage with a current sensor. Current runs through each PR in the row to be read and then to the sensors in the bit lines, but significant current does not run through the other rows because their resistances are high. A top ferroelectric FEt that is polarized compresses the PR the other half of the way, dropping its resistance significantly so that a large current is read by that bit line sensor. A top ferroelectric FEt that is unpolarized does not compress the PR any more than the bottom FEb already compresses it, and therefore the PR resistance remains high. The current through that PR is therefore low in the bit line sensor. In this way, the states of polarization in all of the FEts in a row can be simultaneously determined by the sensors. This read operation is non-destructive because FEt is unchanged by the small applied voltage $\epsilon$.

The standby state for all of the word lines and bit lines is zero voltage. The top ferroelectric, FEt, keeps its polarization state with zero voltage, and thus the memory is non-volatile. It should also be noted that the bottom FEb in each element could be replaced by a piezoelectric that requires a continuously applied voltage during the read-row step to compress the PR.

Figure 10:
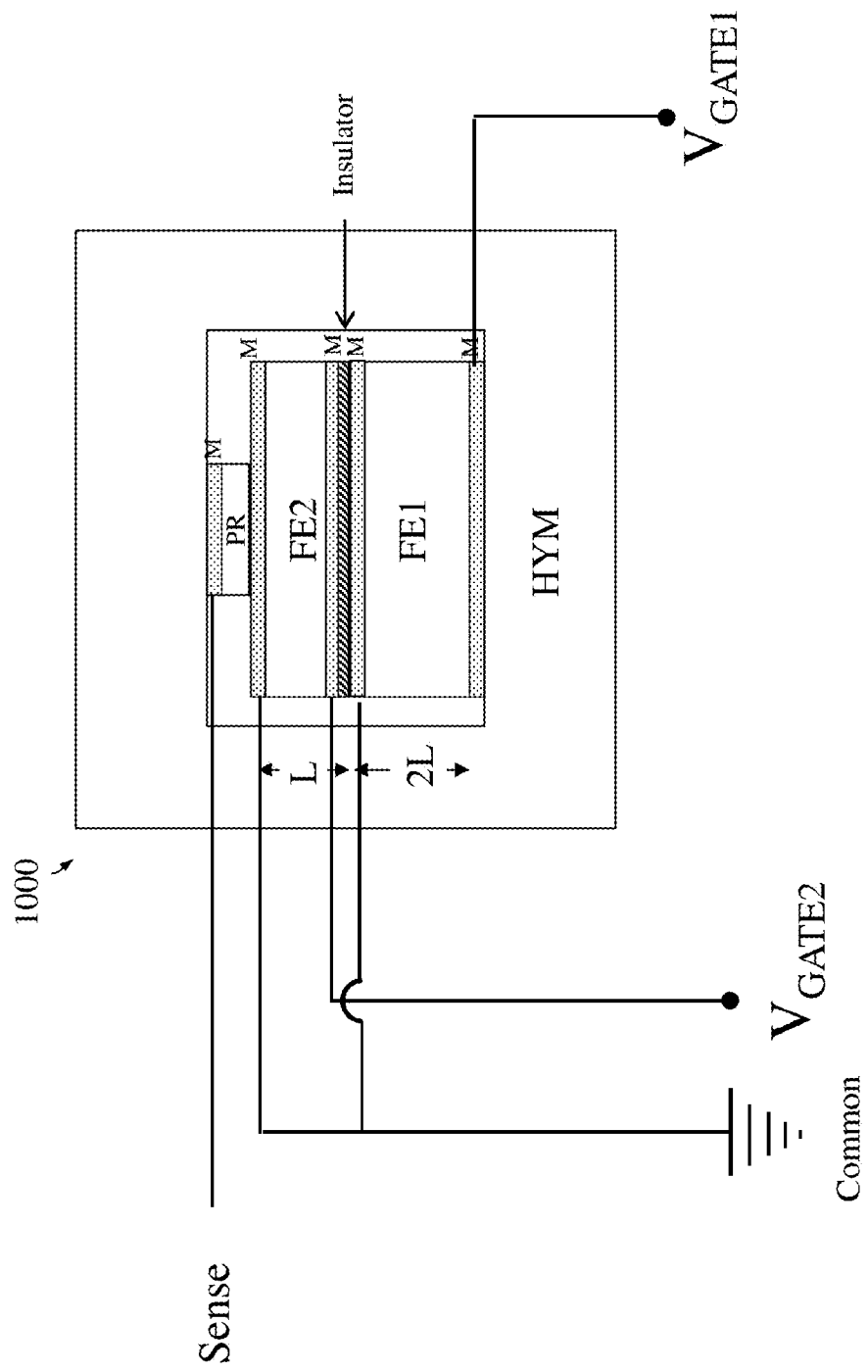
FIG. 10 is a schematic, cross sectional view of a multibit memory storage element, in accordance with a further embodiment.

Referring now to FIG. 10, there is shown a schematic, cross sectional view of a multibit memory storage element 1000, in accordance with a further embodiment. In this embodiment, the element 1000 is capable of storing two bits. The memory storage element 1000 includes two FE layers, FE1 and FE2, wherein FE1 has a thickness of about twice that of FE2. Both FE1 and FE2 are controlled by a pair of gate contacts, and are insulated from one another. The electric field (and thus polarization and strain) in each FE element is selected to be the same, wherein twice the magnitude of voltage is applied across FE1 to reach saturation polarization with respect to FE2. The states of the system are depicted in the table below:

TABLE 1

States of 2 bit memory

| polarization | none | 2 (FE2) | 1 (FE1) | 1 + 2 (FE1 and FE2) |
|---|---|---|---|---|
| $\Delta l$ | 0 | $\Delta l_0$ | 2 $\Delta l_0$ | 3 $\Delta l_0$ |

In Table 1, $\Delta l$ is the intrinsic length expansion of the FE1+FE2 stack under different polarization combinations, with $\Delta l_0$ being the expansion for FE2. Given the exponential behavior of resistivity vs. stress/strain in the PR characteristic graph of FIG. 4, these values may easily be made distinguishable in terms of read current. The 4 different states can therefore be read, which defines a 2-bit memory element. Expanding this concept further, three stacked FEs with thicknesses of L, 2L, and 4L, could store 8 states, thereby providing a Byte of data in a single device footprint. It should be readily apparent to those skilled in the art that other combinations of FE thicknesses and remnant polarizations, as well as other contact dispositions, are also possible to attain different numbers of states.

Figure 11:
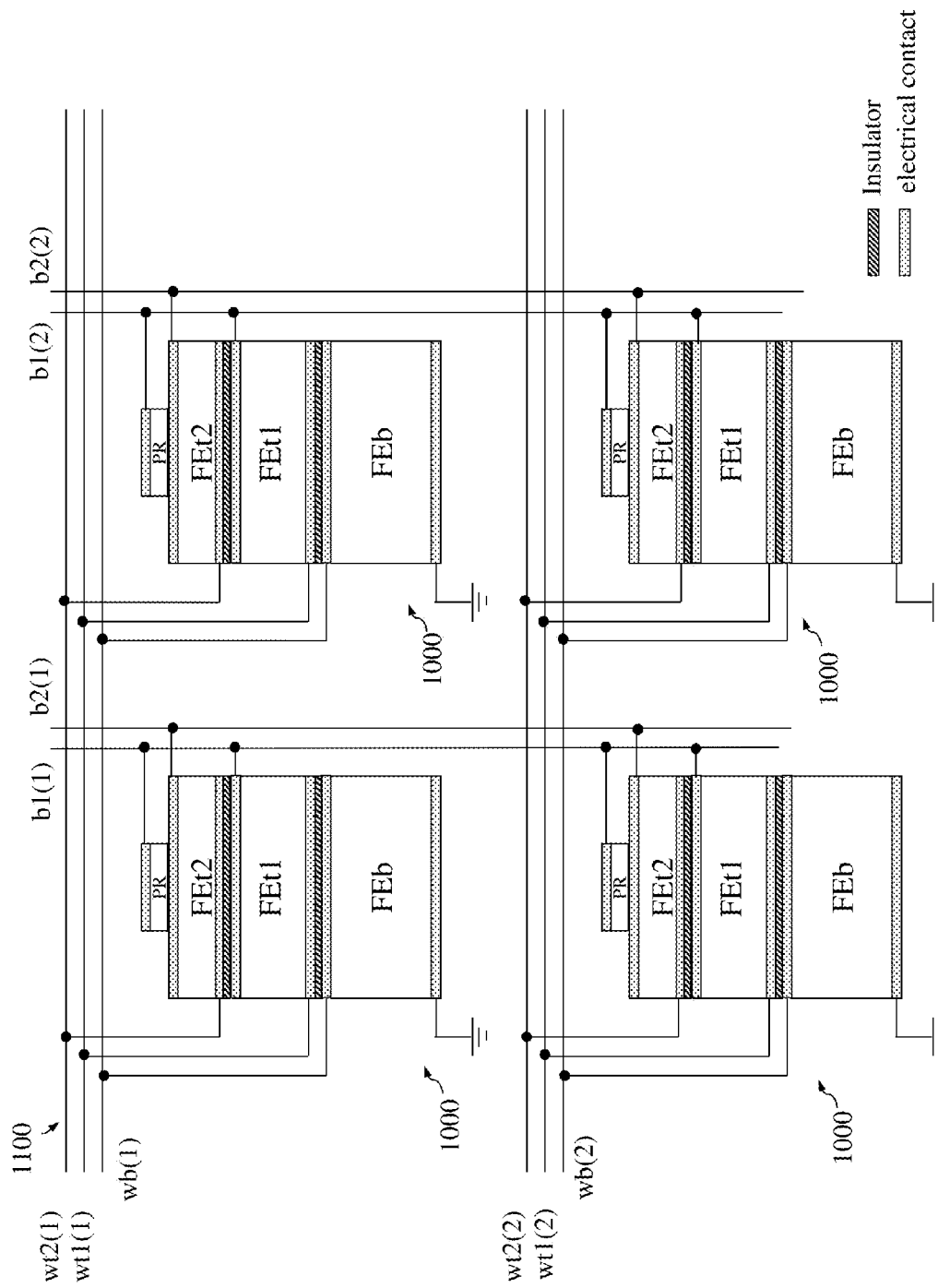
FIG. 11 is a schematic diagram of an exemplary cross-point array for the multibit memory element of FIG. 10.

An exemplary cross-point array 1100 for the multibit memory element 1000 of FIG. 10 is shown in FIG. 11. For ease of illustration, the surrounding HYM is omitted for the elements 1000. The array 1100 of FIG. 11 is written in a similar manner to that of FIG. 8, except that there are now additional word and bit lines to control the additional FEs in each memory element 1000. A read operation for the array 1100 of FIG. 11 senses a small current from bit line b1(m) to bit line b2(m) when the bottom word line in the row, wb, is activated by a voltage. Other wiring arrangements are possible, however. As is the case with the FIG. 8 embodiment, the bottom FE layer in each element 1000 may be replaced by a piezoelectric layer.

Figure 12:
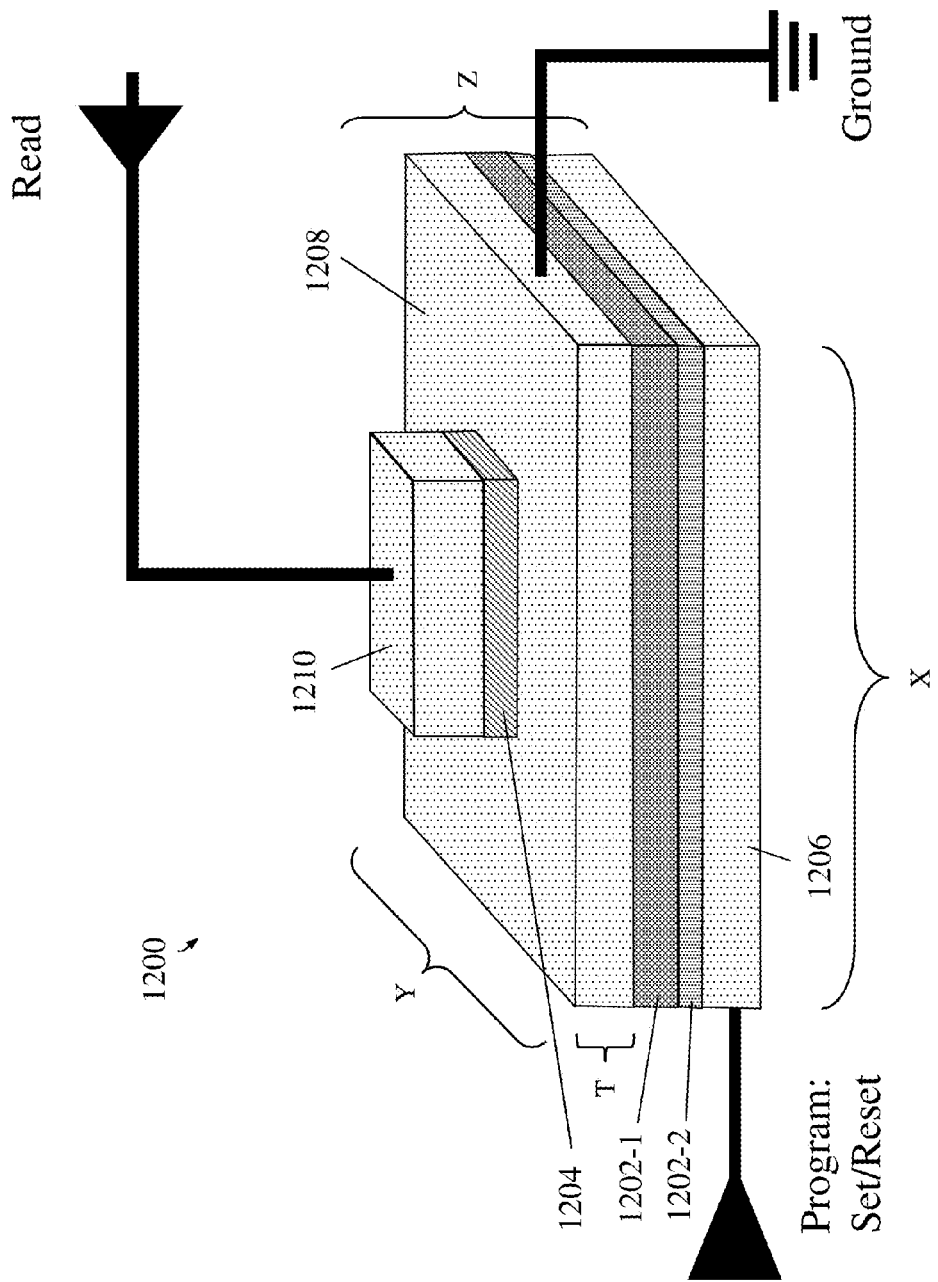
FIG. 12 is a schematic, perspective view of another multibit memory storage element, in accordance with a further embodiment.

Referring now to FIG. 12, there is shown a schematic, perspective view of another multibit memory storage element 1200, in accordance with a further embodiment. Similar to the embodiment of FIG. 10, the storage element 1200 includes a pair of FE layers, 1202-1 and 1202-2. A PR element 1204 is also in mechanical contact with the FE stack; however, unlike the FIG. 10 embodiment in which the FE layers are each controlled by a separate pair of electrodes and separated from one another by an insulator layer, FE layers 1202-1 and 1202-2 are in contact with one another and both controlled by a single pair of electrodes 1206, 1208 (similar to the FIG. 1 embodiment). The PR element is disposed between electrodes 1208 and 1210. Exemplary dimensions for the storage element in FIG. 12 may be X≈45-90 nm; Y≈45-90 nm; Z≈35-90 nm; and T≈6-12 nm.

Figure 13A:
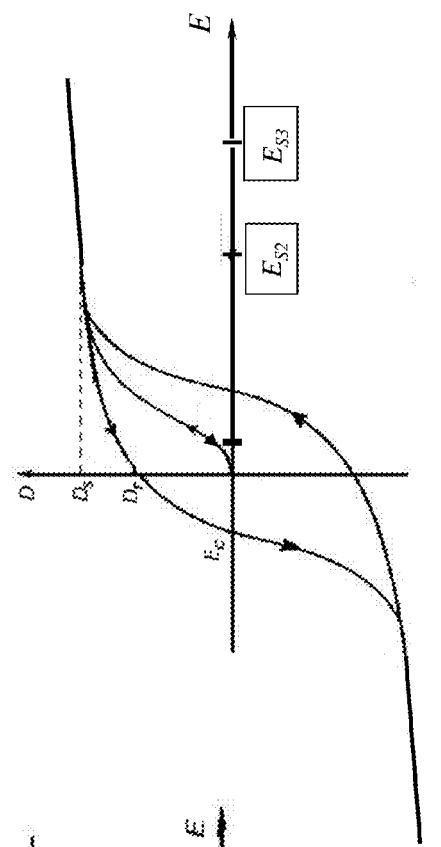
FIG. 13A is a graph illustrating hysteretic polarization of a first piezoelectric material of the memory storage device of FIG. 12.
Figure 13B:
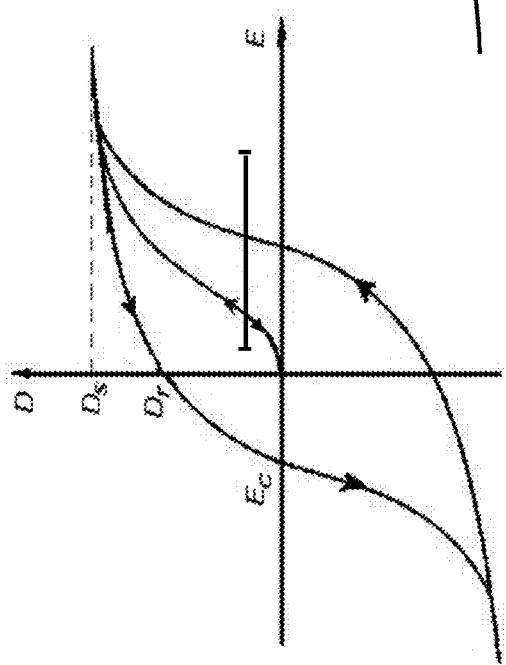
FIG. 13B is a graph illustrating hysteretic polarization of a second piezoelectric material of the memory storage device of FIG. 12.
Figure 14:
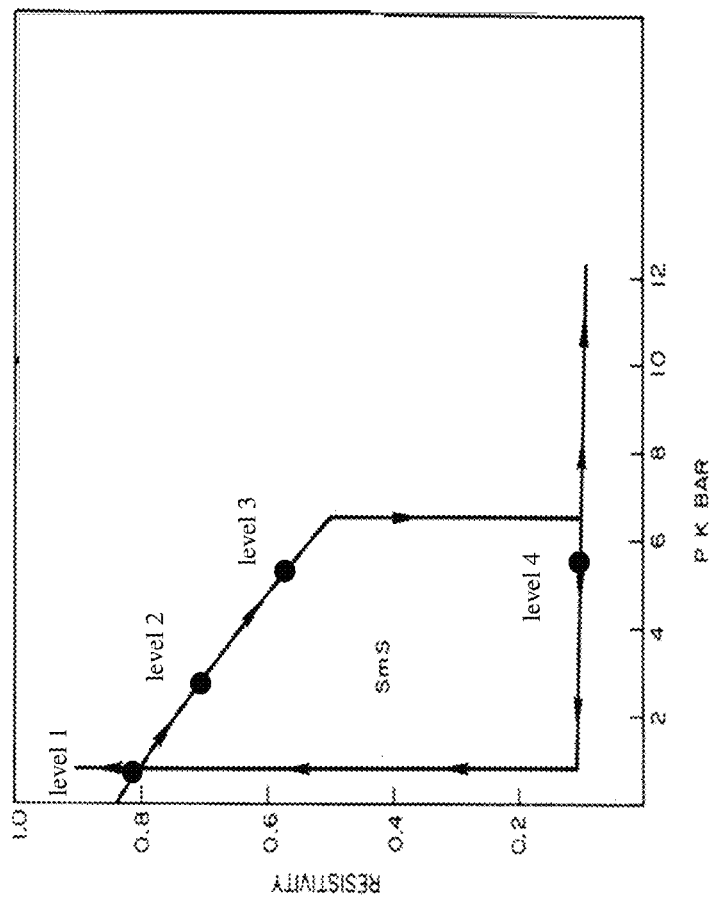
FIG. 14 is a pressure versus resistance curve illustrating four separate programmable states for the memory storage device of FIG. 12.

In order to produce four different logic states in a nonvolatile manner, the piezo materials for FE layers 1202-1 and 1202-2 are selected to be different from one another. In addition, and as illustrated collectively by FIGS. 13A, 13B and 14, the dimensions and materials of the multibit memory storage element 1200 are tailored such that for a first logic state (level 1) both FE layers 1202-1 and 1202-2 are depolarized, resulting in a high resistivity cell. For a second logic state (level 2), the applied electric field is ≈$E_{S3}$ such that the remanent polarization is set to $D_{r2}$ and results in a displacement such that $P_2 < 6.2$ kbar. For a third logic state (level 3), the applied electric field is ≈$E_{S3}$ such that the remanent polarization is set to $D_{r3}$ and results in a displacement such that $P_3 < 6.2$ kbar, but still greater than $P_2$ in order to have a lower resistivity at level 3. Then, for the fourth logic state (level 4), the applied electric field is greater than $E_{S3}$ such that the remanent polarization is set to $D_{r4}$ and results in a displacement such that $P_4 > 6.2$ kbar, and resulting in a dramatic drop in resistivity.

Figure 15:
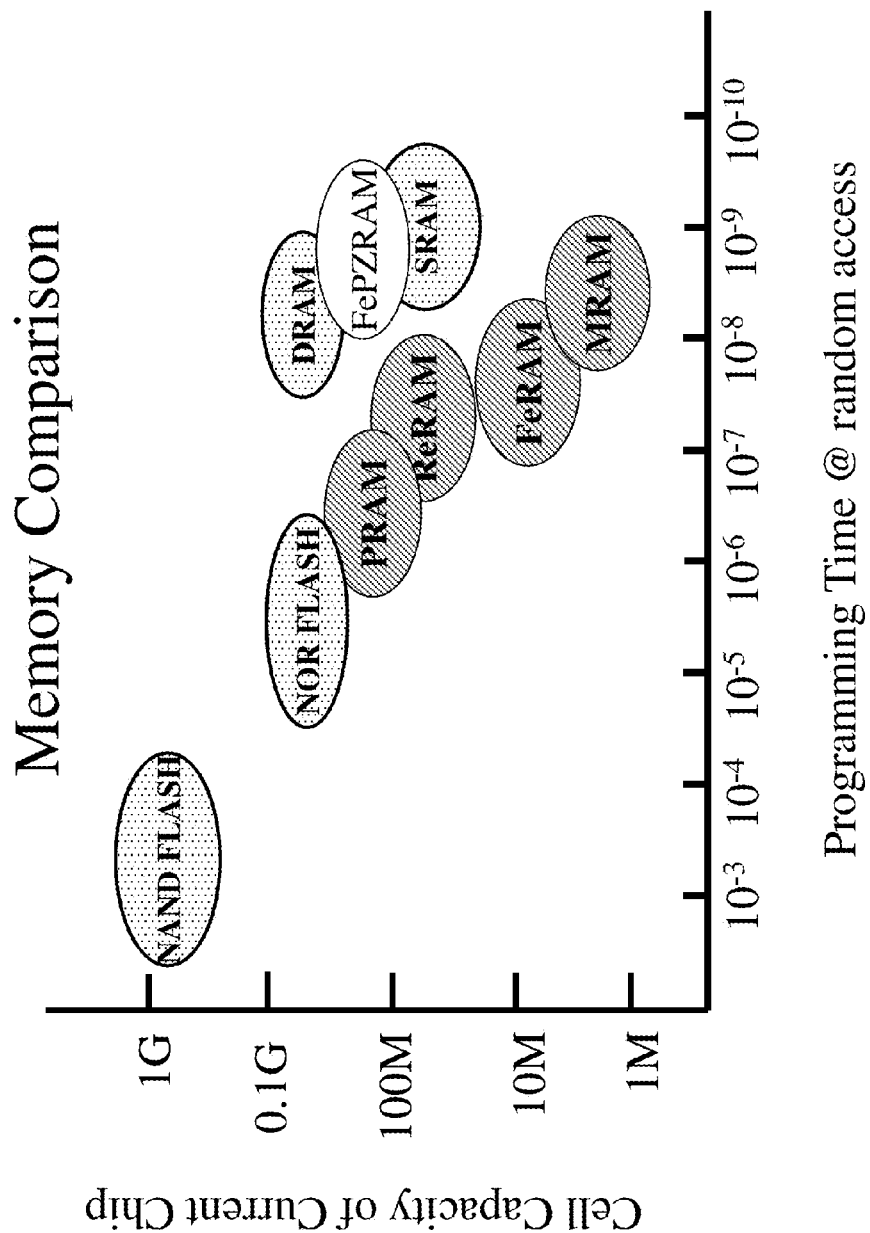
FIG. 15 is a graph comparing programming time versus memory density for various memory technologies.

FIG. 15 is a graph comparing programming time versus memory density for various memory technologies. Generally, these properties tend to anticorrelate, covering a range from the highest storage density/slowest speed NAND FLASH to lower density, faster technologies such as SRAM and MRAM. It is estimated that the presently disclosed technology, termed FePZRAM herein, will lie somewhere between DRAM and SRAM in terms of memory storage density and speed. However, this determination will ultimately be made upon further research. Advantageously, FePZRAM is a non-volatile memory technology, unlike SRAM and DRAM. Another important consideration not illustrated in the graph of FIG. 15 is power, and here the distinction of FePZRAM is the capability to operate at low voltage and compatibility with the low voltage Piezoelectric technology. FePZRAM also is capable of being developed vertically to increase storage density (e.g., FIGS. 8, 10, 12). These capabilities are at present unique and make FePZRAM desirable for future low power computing technology.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A multibit, nonvolatile memory storage device, comprising:
    a first ferroelectric (FE) material and a second FE material coupled with a piezoresistive (PR) material through an inherent piezoelectric response of the first FE material and second FE material, and arranged in a single stack, wherein an electrical resistance of the PR material is dependent upon on a compressive stress applied thereto, the compressive stress caused by a remanent strain of the first FE material and the second FE material resulting from a polarization of the first FE material and a polarization of the second FE material such that the PR material is set to assume one of a first resistance value, a second resistance value, a third resistance value of the PR material, and a fourth resistance value.

2. The multibit, nonvolatile memory storage device of claim 1, wherein:
    the first and second FE materials are polarized by initial application of a voltage thereacross to result in an initial polarization $D_s$, and thereafter by removal of the voltage to leave the first and second FE materials with a remanent polarization $D_r$; and
    the first and second FE materials are depolarized by applying an alternating voltage of decreasing amplitude thereacross.

3. The multibit, nonvolatile memory storage device of claim 2, wherein the first FE material is disposed between first and second electrodes, the second FE material is disposed between third and fourth electrodes and the PR element is disposed between the fourth electrode and a fifth electrode, and wherein the second and third electrodes are electrically insulated from one another.

4. The multibit, nonvolatile memory storage device of claim 3, wherein:
    a depolarized state of the first FE material and a depolarized state of the second FE material results in the first resistance value of the PR material;
    the depolarized state of the first FE material and a polarized state of the second FE material results in the second resistance value of the PR material;
    a polarized state of the first FE material and the depolarized state of the second FE material results in the third resistance value of the PR material; and
    the polarized state of the first FE material and the polarized state of the second FE material results in the fourth resistance value of the PR material.

5. The multibit, nonvolatile memory storage device of claim 4, wherein the first FE material has a thickness of about twice that of the second FE material.

6. The multibit, nonvolatile memory storage device of claim 2, wherein the first FE material and the second FE material are in contact with one another and are disposed between first and second electrodes, and the PR element is disposed between the second electrode and a third electrode.

7. The multibit, nonvolatile memory storage device of claim 6, wherein the first FE material and the second FE material are different from one another such that:
    a depolarized state of the first and second FE materials results in the first resistance value of the PR material;
    a first polarized state of the first and second FE materials results in the second resistance value of the PR material;
    a second polarized state of the first and second FE materials results in the third resistance value of the PR material; and
    a third polarized state of the first and second FE materials results in the fourth resistance value of the PR material.

8. The multibit, nonvolatile memory storage device of claim 1, wherein:
    the first FE material, the second FE material and the PR material define a storage transistor; and
    the multibit, nonvolatile memory storage device further comprises an access transistor formed in the single stack with the storage transistor, the access transistor further comprising a third FE material mechanically coupled to and electrically insulated from the first FE material and the second FE material.

* * * * *